(12) United States Patent
Okamura et al.

(10) Patent No.: US 9,793,109 B2
(45) Date of Patent: Oct. 17, 2017

(54) PERHYDROPOLYSILAZANE, COMPOSITION CONTAINING SAME, AND METHOD FOR FORMING SILICA FILM USING SAME

(71) Applicant: AZ ELECTRONIC MATERIALS (LUXEMBOURG) S.A.R.L., Luxembourg (LU)

(72) Inventors: Toshiya Okamura, Kakegawa (JP); Takashi Kanda, Kakegawa (JP); Issei Sakurai, Kakegawa (JP); Bertram Bernd Barnickel, Kakegawa (JP); Hiroyuki Aoki, Kakegawa (JP)

(73) Assignee: AZ Electronic Materials (Luxembourg) S.à.r.l., Luxembourg (LU)

( * ) Notice: Subject to any disclaimer, the term of this patent is extended or adjusted under 35 U.S.C. 154(b) by 0 days.

(21) Appl. No.: 15/039,440

(22) PCT Filed: Dec. 8, 2014

(86) PCT No.: PCT/JP2014/082468
§ 371 (c)(1),
(2) Date: May 26, 2016

(87) PCT Pub. No.: WO2015/087847
PCT Pub. Date: Jun. 18, 2015

(65) Prior Publication Data
US 2016/0379817 A1    Dec. 29, 2016

(30) Foreign Application Priority Data
Dec. 9, 2013 (JP) ................................. 2013-254456

(51) Int. Cl.
*C01B 21/087* (2006.01)
*H01L 21/02* (2006.01)
*C08G 77/62* (2006.01)
*C09D 1/00* (2006.01)

(52) U.S. Cl.
CPC ...... *H01L 21/02222* (2013.01); *C01B 21/087* (2013.01); *C08G 77/62* (2013.01); *C09D 1/00* (2013.01); *H01L 21/02164* (2013.01); *H01L 21/02282* (2013.01)

(58) Field of Classification Search
CPC .................................................... C01B 21/087
See application file for complete search history.

(56) References Cited

U.S. PATENT DOCUMENTS

| | | | |
|---|---|---|---|
| 4,975,512 A | 12/1990 | Funayama et al. | |
| 2004/0224537 A1 | 11/2004 | Lee et al. | |
| 2007/0078252 A1 | 4/2007 | Dioumaev | |
| 2010/0203299 A1* | 8/2010 | Abdallah | G03F 7/40 428/195.1 |
| 2012/0156893 A1 | 6/2012 | Oxaki et al. | |
| 2012/0164382 A1 | 6/2012 | Yun et al. | |
| 2012/0177829 A1 | 7/2012 | Lim et al. | |
| 2013/0017662 A1 | 1/2013 | Park et al. | |
| 2015/0004421 A1 | 1/2015 | Fujiwara et al. | |

FOREIGN PATENT DOCUMENTS

| | | |
|---|---|---|
| JP | 1-138107 A | 5/1989 |
| JP | 2613787 B2 | 2/1997 |
| JP | 2651464 B2 | 5/1997 |
| JP | 2005-150702 A | 6/2005 |
| JP | 2009-511670 A | 3/2009 |
| JP | 2011-142207 A | 7/2011 |
| JP | 2013-162072 A | 8/2013 |
| WO | 2011/027826 A1 | 3/2011 |

* cited by examiner

*Primary Examiner* — Margaret Moore
(74) *Attorney, Agent, or Firm* — Mitchell Brustein

(57) ABSTRACT

[Problem] To provide a perhydropolysilazane making it possible to form a siliceous film with minimal defects, and a curing composition comprising the perhydropolysilazane. [Means for Solution] The present invention provides a perhydropolysilazane having a weight-average molecular weight of 5,000 to 17,000, characterized in that when $^1$H-NMR of a 17% by weight solution of said perhydropolysilazane dissolved in xylol is measured, the ratio of the amount of $SiH_{1,2}$ based on the aromatic ring hydrogen content of the xylol is 0.235 or less and the ratio of the amount of NH based on the aromatic ring hydrogen content of the xylol is 0.055 or less, and a curing composition comprising the perhydropolysilazane. The present invention also provides a method for forming a siliceous film, comprising coating the curing composition on a substrate and heating.

12 Claims, 1 Drawing Sheet

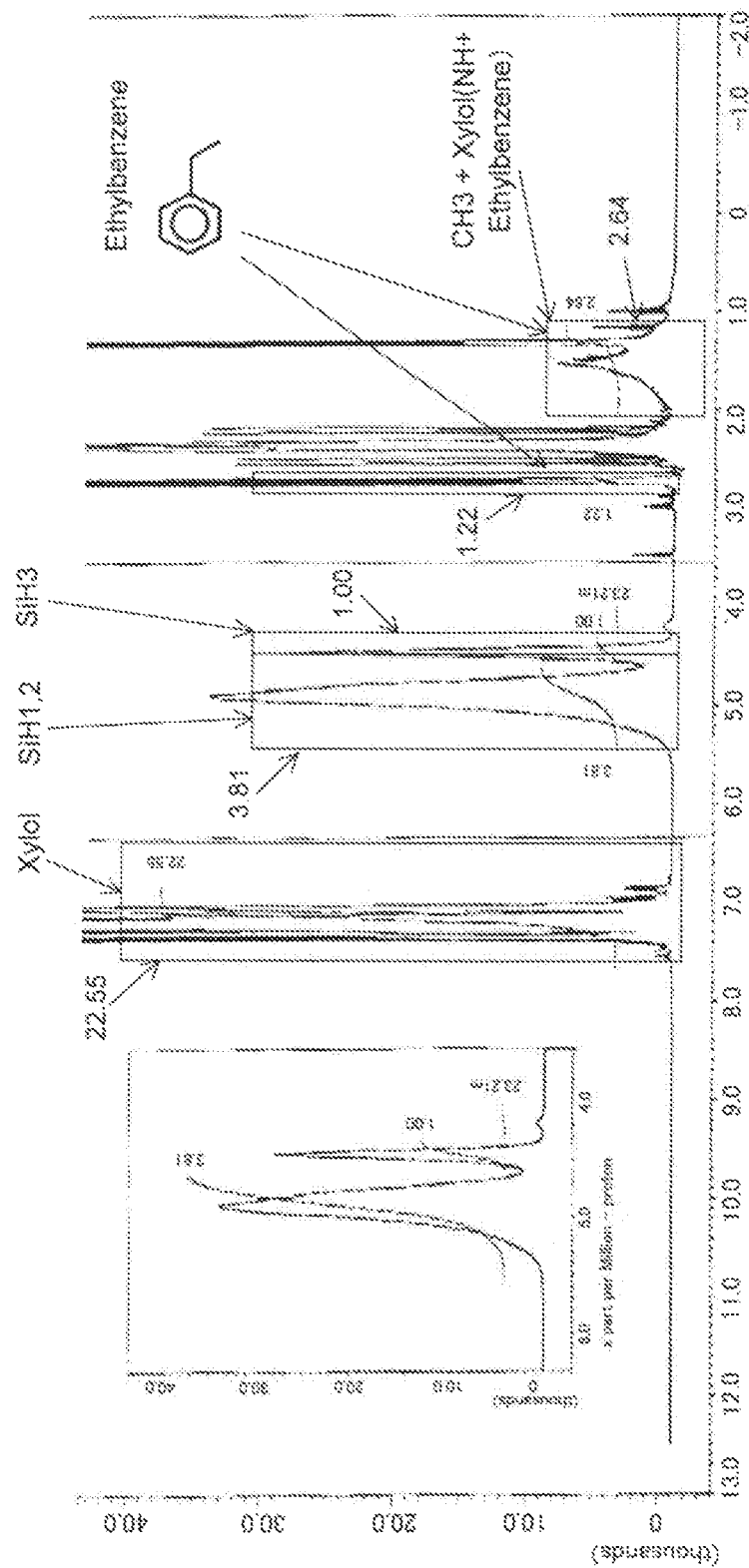

PERHYDROPOLYSILAZANE, COMPOSITION CONTAINING SAME, AND METHOD FOR FORMING SILICA FILM USING SAME

BACKGROUND OF THE INVENTION

Technical Field

The present invention relates to a perhydropolysilazane making it possible to form a siliceous film with minimal defects in a manufacturing process of semiconductor devices and the like, and a composition comprising the perhydropolysilazane. Further, the present invention also relates to a method for forming a siliceous film using the same.

Background Art

In manufacture of electronic devices, especially semiconductor devices, an interlayer insulating film may be formed between a transistor element and a bit line, between a bit line and a capacitor, between a capacitor and a metal wiring, between a plurality of metal wirings, and the like. Furthermore, an insulating material may be filled in isolation trenches provided on a substrate surface and the like. Furthermore, after forming a semiconductor element on a substrate surface, a coating layer may be formed using a sealing material to provide a package. The interlayer insulating film and the coating layer are often formed from a siliceous material.

On the other hand, in the field of electronic devices, micronization of device rules has been gradually made progress, and micronization of the size of an insulating structure isolating each element incorporated into a device has been required. However, according to the progress of micronization of the insulation structure, occurrence of defects in a siliceous film constituting a trench has been increased. Hence, the problem with reduction in yield rate of electronic devices is becoming serious.

On the other hand, as a method for forming a siliceous film, a chemical vapor deposition method (CVD method), a sol-gel method, a method for applying a composition comprising a silicon-containing polymer and baking, and the like are used. Among these, the method for forming a siliceous film using a composition is often employed since it is relatively simple. To form the siliceous film, a composition comprising a silicon-containing polymer such as polysilazane, polysiloxane, polysiloxazane or polysilane is applied on a surface of a substrate or the like and baked to oxidize the silicon contained in the polymer to form a siliceous film. In such a case, a method for reducing defects in the formed siliceous film has been studied.

For example, a method for reducing defects in the siliceous film by reducing the polymeric component having an excessive molecular weight in a composition comprising a hydrogenated polysilazane or polysiloxazane (Patent Document 1), a method for reducing defects in the formed siliceous film by controlling the chlorine content in a hydrogenated siloxazane solution (Patent Document 2), and the like have been studied. However, according to the study by the present inventors, sufficient reduction of defects cannot be sometimes achieved by these methods, and therefore there has been room for further improvement.

Further, a filler comprising polysilazane and polysiloxazane having a specific elemental composition for filling a gap on a semiconductor element (Patent Document 3), a film-forming composition using a polysilazane having a specific structure (Patent Documents 4 and 5), and the like have been also studied. However, the compositions which are described in these documents are not for reducing defects in the formed siliceous film or silicon nitride film, and thus sufficient effects are not recognized from this viewpoint.

PRIOR ART DOCUMENTS

Patent Documents

Patent Document 1: US 2012/164,382A1
Patent Document 2: US 2012/177,829A1
Patent Document 3: US 2013/017,662A1
Patent Document 4: Japanese Patent No. 2,613,787
Patent Document 5: Japanese Patent No. 2,651,464

SUMMARY OF THE INVENTION

Problems to be Solved by the Invention

In view of the above problems, in the case of forming a siliceous film, a silicon-containing polymer or a composition comprising the same, which can suppress or prevent the occurrence of defects and form a siliceous film with minimal defects, is desired.

Means for Solving the Problems

The perhydropolysilazane of the present invention is a perhydropolysilazane having a weight-average molecular weight of 5,000 to 17,000, characterized in that when 1H-NMR of a 17% by weight solution of said perhydropolysilazane dissolved in xylol is measured, the ratio of the amount of $SiH_{1,2}$ based on the aromatic ring hydrogen content of the xylol is 0.235 or less and the ratio of the amount of NH based on the aromatic ring hydrogen content of the xylol is 0.055 or less.

Further, the curing composition of the present invention comprises said perhydropolysilazane and a solvent.

Further, the method for forming a siliceous film of the present invention comprises coating said curing composition on a substrate and heating.

Effects of the Invention

The perhydropolysilazane of the present invention has high stability against oxidation, and it is possible to form a siliceous film having less defects using a composition comprising the perhydropolysilazane. Further, the resultant siliceous film also has features that its shrinkage during curing is small, that the wet etching rate is small, and that cracks are hardly generated. Therefore, by forming electronic devices using this composition, it is possible to improve the yield rate of electronic devices.

BRIEF DESCRIPTION OF THE DRAWINGS

FIG. 1 shows a NMR spectrum of a perhydropolysilazane, which is one aspect of the present invention.

DETAILED DESCRIPTION OF THE INVENTION

Mode for Carrying out the Invention

Embodiments of the present invention are described below in detail.

[Perhydropolysilazane]

The perhydropolysilazane of the present invention (hereinafter referred to as "PHPS") contains a Si—N bond as a repeating unit and is a silicon-containing polymer consisting only of Si, N and H. In this PHPS, all elements binding to Si or N are H, except Si—N bond, and any other elements such as carbon or oxygen are not substantially contained. The simplest structure of the perhydropolysilazane is a chain structure comprising a repeating unit of the following formula (I):

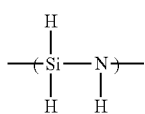
(I)

In the present invention, any PHPS having a chain structure and a cyclic structure in a molecule may be used, and for example, a PHPS comprising repeating units of the following general formulae (Ia) to (If) and a terminal group of the following general formula (Ig) in a molecule is used:

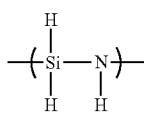
(Ia)

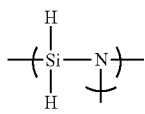
(Ib)

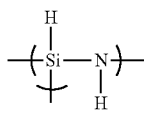
(Ic)

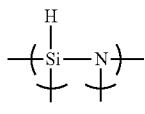
(Id)

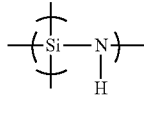
(Ie)

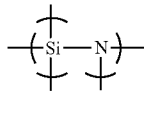
(If)

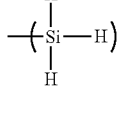
(Ig)

Such a PHPS is that comprising a branched structure and a cyclic structure in a molecule, and an example of a specific partial structure of such a PHPS is that represented by the following general formula:

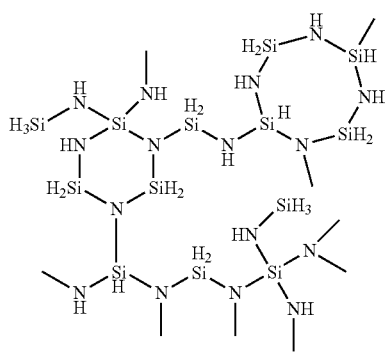

Further, it may comprise a structure represented by the following formula, i.e. a structure wherein a plurality of Si—N molecular chains are crosslinked:

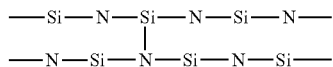

So far as the PHPS of the present invention comprises Si—N bonds as a repeating unit and is a silicon-containing polymer consisting only of Si, N and H, its structure is not limited and may take various structures other than those exemplified above. For example, it may comprise a structure composed by combining the above-described linear structure, cyclic structure and crosslinked structure. In addition, the PHPS in the present invention preferably comprises a cyclic structure or crosslinked structure, particularly crosslinked structure.

It is necessary for the PHPS of the present invention to have a specific molecular weight. When heating the composition comprising the PHPS of the present invention to convert to siliceous, the weight-average molecular weight of the PHPS is preferably large in order to reduce the scattering (evaporation) of low-molecular components, and to prevent the volume shrinkage due to the scattering of the low-molecular components and thus density reduction inside the fine trenches. From this point of view, the weight-average molecular weight of the PHPS of the present invention needs to be 5,000 or more, preferably 5,700 or more. On the other hand, when the composition is prepared by dissolving the PHPS in a solvent, it is necessary to increase the coatability of the composition. In particular, it is necessary that the viscosity of the composition is not excessively high and that the curing rate of the composition is controlled in order to ensure its penetration to concavo-convex portions. From this point of view, the weight-average molecular weight of the PHPS of the present invention needs to be 17,000 or less, preferably 15,000 or less. Here, the weight-average molecular weight means a weight-average molecular weight in terms of polystyrene, which can be measured by the gel permeation chromatography based on polystyrene.

Further, the PHPS of the present invention is characterized by its molecular structure and by less —$SiH_{1,2}$— and —NH— structures compared to any PHPS that has been generally known. In other words, branched structures or crosslinked structures are contained relatively more in the PHPS molecule. Specifically, the repeating unit (Ia) constituting the PHPS are contained relatively less and those (Ib) to (If) are contained more.

Features of such a structure can be detected by the quantitative NMR. In other words, the PHPS of the present invention exhibits a specific characteristic value when assessed by the quantitative NMR. The quantitative NMR is known as a method for performing a quantitative determination of terminal group etc. using NMR. Specifically, an analysis is performed by comparing the integral values of the signals derived from an internal standard material and a measuring target substance (internal standard method). One feature of the PHPS of the present invention is that when $^1$H-NMR is measured using xylol (xylene) as an internal standard substance, (1) a relative value to the aromatic ring hydrogen in xylol of total amount of $SiH_2$ (corresponding to the above formulae (Ia) and (Ib)) and $SiH_1$ (corresponding to the above formulae (Ic) and (Id)) in a PHPS molecule (hereinafter referred to as "$SiH_{1,2}$") and (2) a relative value to the aromatic ring hydrogen in xylol of total amount of NH (corresponding to the above formulae (Ia), (Ic) and (Ie)) in a PHPS molecule (hereinafter referred to as "R(NH)") are within specific ranges. In this regard, the above formula (If) can be ignored because it is not detected by $^1$H-NMR.

In the present invention, measurement of the quantitative NMR is specifically carried out as follows:

First, a sample (PHPS) is dissolved at a concentration of 17% by weight in xylol to prepare a polymer solution. Then, 51 mg of the resulting polymer solution is dissolved in 1.0 g of a deuterated solvent, for example, deuteriochloroform (manufactured by Kanto Chemical Co., Inc.) to obtain a sample solution. Using JNM-ECS400 type nuclear magnetic resonance spectrometer (tradename, manufactured by JEOL Ltd.), $^1$H-NMR of a sample solution is measured 64 times to obtain a NMR spectrum. FIG. 1 is an example of a NMR spectrum of the PHPS of the present invention obtained by such a method. In this NMR spectrum, a peak assigned to $SiH_1$ and $SiH_2$ of the PHPS (near $\delta=4.8$ ppm), a peak assigned to $SiH_3$ of the PHPS (near $\delta=4.4$ ppm), a peak assigned to NH of the PHPS (near $\delta=1.5$ ppm), and a peak assigned to aromatic ring hydrogens of xylol (near $\delta=7.2$ ppm) are recognized. Further, a peak assigned to hydrogens contained in ethyl group of ethylbenzene that is contained as an impurity in xylol used for an internal standard substance ($\delta=2.7$ ppm) is also recognized. Another peak assigned to hydrogens contained in ethyl group of the same ethylbenzene appears also near $\delta=1.3$ ppm, and this peak overlaps with a peak near $\delta=1.5$ ppm, which is assigned to NH. However, since the required ethyl group of the ethylbenzene is quantified based on the peak of $\delta=2.7$ ppm, the amount of NH can be quantified by subtracting it. Similarly a peak assigned to hydrogens contained in phenyl group of the ethylbenzene appears near $\delta=7.2$ ppm and this peak overlaps with a peak near $\delta=7.2$ ppm, which are assigned to the aromatic ring hydrogens of xylol. However, the phenyl group of the ethylbenzene is quantified based on the peak of $\delta=2.7$ ppm, the xylol aromatic ring hydrogens can be quantified by subtracting it.

Based on the NMR spectrum shown in FIG. 1, spectral integral values corresponding to each hydrogen (a), spectral integral values corrected taking the effect of hydrogens of ethylbenzene into account (b), and a ratio of the amount of hydrogens based on the amount of xylol aromatic ring hydrogens available from them (c) are obtained as follows:

TABLE 1

|  | peak position | spectral integral value (a) | corrected spectral integral value (b) | ratio of the amount of hydrogens (c) |
| --- | --- | --- | --- | --- |
| SiH1 + SiH2 | about 4.8 ppm | 3.81 | 3.81 | 0.195 |
| SiH3 | about 4.4 ppm | 1.00 | 1.00 | 0.051 |
| ArH (xylol) | about 7.2 ppm | 22.55 | 19.5 | 1.00 |
| CH2(ethylbenzen) | about 2.7 ppm | 1.22 | — | — |
| NH + CH3 (ethylbenzen) | about 1.5 ppm | 2.64 | — | — |
| NH | about 1.5 ppm | — | 0.81 | 0.042 |

In this regard, in the table, the corrected spectral integral values (b) with respect to ArH and NH are obtained as follows:

ArH: (spectral integral value (a) of ArH)−[spectral integral value (a) of CH2 (ethylbenzene)]×(5/2)=22.55−1.22×(5/2)=19.5

NH: {spectral integral value (a) of [NH+CH3 (ethylbenzene)]}−[spectral integral value (a) of CH2 (ethylbenzene)]×(3/2)=2.64−1.22×(3/2)=0.81

In the PHPS of the present invention, the smaller the $R(SiH_{1,2})$ is, the stronger the effect of the present invention is exhibited and the less defects tend to generate when a siliceous film is formed. Thus, $R(SiH_{1,2})$ is 0.235 or less, preferably 0.230 or less. On the other hand, it is very difficult to synthesize a PHPS containing no repeating units (Ia) to (Id). Therefore, $R(SiH_{1,2})$ is generally 0.187 or more, preferably 0.195 or more, from the viewpoint of easiness of manufacturing a PHPS, inter alia solubility of the polymer synthesized.

Further, in the PHPS of the present invention, the smaller the R(NH) is, the stronger the effect of the present invention is exhibited and the less defects tend to generate when a siliceous film is formed. Thus, R(NH) is 0.055 or less, preferably 0.050 or less. On the other hand, it is difficult to synthesize a PHPS containing no repeating unit (Ia) or (Ic). Therefore, R(NH) is generally 0.038 or more, preferably 0.042 or more, from the viewpoint of easiness of manufacturing a PHPS, inter alia solubility of the polymer synthesized.

From the same reason as described above, the ratio of the total amount of $SiH_2$ and $SiH_1$ based on the amount of $SiH_3$ or the amount of NH based on the amount of all hydrogens is preferred to be smaller.

In addition, for the measurement of qNMR in the present invention, a solution having 17% concentration of a PHPS relative to xylol is used in principle. However, if the xylol 17% by weight solution cannot be adjusted because of the solubility of the PHPS, and if measuring an existing solution is advantageous, it is also possible to convert the measured concentration of the solution into 17% by weight concentration.

The PHPS having such a specific structure is characterized by being hardly oxidized when being applied onto a substrate as a composition to come in contact with the atmosphere. Further, when a siliceous film is formed using the PHPS of the present invention, the number of defects is suppressed. The reason thereof is considered that due to a specific structure of the PHPS, its reactivity with water vapor is suppressed, and therefore, for example, the oxidation due to the atmosphere immediately after coating of the PHPS is suppressed, curing reaction is controlled to an appropriate speed and as a result occurrence of defects is suppressed.

[Method for Producing Perhydropolysilazane]

The PHPS of the present invention can be generally synthesized by forming an inorganic polysilazane of low molecular weight and further by conducting polycondensation of the inorganic polysilazane of low molecular weight in the presence of a basic compound. Here, the PHPS of the present invention can be produced by reacting at relatively high temperature and for relatively long time compared to conventional methods.

The method for manufacturing the PHPS of the present invention is explained more specifically below.

First, dichlorosilane as a raw material is reacted with ammonia in a solvent such as dichloromethane or benzene to form an inorganic polysilazane of low molecular weight. Alternatively, the inorganic polysilazane of low molecular weight may be formed by reacting a basic compound such as pyridine with dichlorosilane to form an adduct and then by reacting ammonia with the adduct.

Then, the inorganic polysilazane of low molecular weight that is an intermediate product is heated in a solvent containing a basic solvent or a basic compound and the PHPS of the present invention can be formed by polycondensation reaction. In this case, as the basic compound, a compound containing a basic element such as nitrogen and phosphorus, for example, tertiary amines, secondary amines having a sterically hindering group, phosphine and the like can be used.

The reaction solvent used in the present invention is a solvent prepared by adding such a basic compound to a non-basic solvent, or a solvent consisting of the basic compound itself. When a basic compound is added to a non-basic solvent, the addition amount of the basic compound, had been conventionally at least 5 parts by weight based on 100 parts by weight of the non-basic solvent (Patent Document 1). However, for obtaining the PHPS specified in the present invention, the ratio of the basic compound is preferably at least 100 parts or more, more preferably 185 parts or more based on 100 parts by weight of the non-basic solvent in order to promote the crosslinking reaction of —$SiH_{1,2}$— and —NH— in the inorganic silazane backbone and to suppress the condensation reaction and the decomposition reaction of —$SiH_3$ and —NH—. If the addition amount of the basic compound is less than this, the polycondensation reaction of —$SiH_{1,2}$— and —NH— is not sometimes smoothly promoted.

As said basic compound or basic solvent, an arbitrary one can be used so long as it does not decompose the inorganic polysilazane. These are, for example, tertiary amines including trialkyl amine such as trimethylamine, dimethylethylamine, diethyl methyl amine and triethylamine, pyridine, picoline, dimethylaniline, pyrazine, pyrimidine, pyridazine and their derivatives, and in addition, pyrrole, 3-pyrroline, pyrazole, 2-pyrazoline and mixtures thereof, and the like. As the non-basic solvent, for example, hydrocarbon solvents such as aliphatic hydrocarbons, alicyclic hydrocarbons and aromatic hydrocarbons; halogenated hydrocarbons such as halogenated methane, halogenated ethane and halogenated benzene; and ethers such as aliphatic ethers and alicyclic ethers can be used. Preferred solvents are halogenated hydrocarbons such as methylene chloride, chloroform, carbon tetrachloride, bromoform, ethylene chloride, ethylidene chloride, trichloroethane and tetrachloroethane; ethers such as ethyl ether, isopropyl ether, ethyl butyl ether, butyl ether, 1,2-dioxyethane, dioxane, dimethyl dioxane, tetrahydrofuran, tetrahydropyran; and hydrocarbons such as pentane, hexane, isohexane, methylpentane, heptane, isoheptane, octane, isooctane, cyclopentane, methylcyclopentane, cyclohexane, methylcyclohexane, benzene, toluene, xylene, ethylbenzene, and the like.

The polycondensation reaction of the present invention is carried out in such a solvent described above, wherein the concentration of the inorganic polysilazane in the solvent is generally 0.1 wt % to 50 wt %, preferably 1 wt % to 12 wt %. If the concentration of the inorganic polysilazane is lower than this, the intermolecular polycondensation reaction does not sufficiently proceed, and if higher than this, the intermolecular polycondensation reaction proceeds too excessively and a gel is formed. The reaction temperature is generally from 40° C. to 200° C., preferably from 80° C. to 140° C. At lower temperature than this, the polycondensation reaction does not sufficiently proceed, and at higher temperature than this, not only a crosslinking reaction, which is intended by the present invention, but also a decomposition reaction of the inorganic polysilazane simultaneously occur. Therefore, the structure control becomes difficult and the polycondensation reaction concurrently proceeds excessively, so that a gel is sometimes formed. As the reaction atmosphere, it is possible to use the atmosphere; however, a hydrogen atmosphere, an inert gas atmosphere such as a dry nitrogen and a dry argon, or mixed atmosphere thereof are preferably used. In the polycondensation reaction in the present invention, although a pressure is applied during the reaction due to the by-product hydrogen, pressurizing is not necessarily required and it is also possible to adopt a normal pressure. In this regard, the reaction time varies depending on the conditions such as the type and concentration of the inorganic polysilazane, the type and concentration of the basic compound or basic solvent, and the polycondensation reaction temperature; however, it is generally sufficient if in the range of from 0.5 hours to 40 hours.

Although the optimal conditions for the polycondensation reaction to form the PHPS of the present invention depend on the average molecular weight and the molecular weight distribution and the like of the inorganic polysilazane, the lower the average molecular weight of the inorganic polysilazane is, the higher the reaction temperature is needed or the longer the reaction time is needed. In other words, when the reaction temperature is made higher or the reaction time is made longer, it is general that the molecular weight of the formed PHPS becomes larger. On the other hand, as described above, if the molecular weight of the PHPS becomes too large, coatability of the composition and solubility of the composition to a synthetic solvent tend to be reduced. In addition, such reaction conditions will cause the manufacturing cost to increase. In fact, at present, the upper limit of the molecular weight of the PHPS which is generally used is 3,000 to 3,500. Therefore, making the reaction temperature higher and the reaction time longer to obtain a PHPS of large molecular weight had been conventionally avoided, since it was concerned that the coatability and solubility to a synthetic solvent were poor so far as the composition comprises such a PHPS.

Under these reaction conditions, the inorganic polysilazane is polymerized to have an increased molecular weight, and at the same time the molecular chains in the polysilazane are cross-linked each other. However, at that time, —$SiH_3$ group existing at the end of the molecular chain does not contribute to the crosslinking reaction, and $SiH_{1,2}$— and —NH— existing in the middle of the molecular chain react, so that the PHPS of the present invention, which contains relatively less $SiH_{1,2}$ and NH, is formed.

In the polycondensation reaction of the present invention, a solvent solution containing the PHPS having an increased molecular weight is obtained. However, in this case, it is preferable to set the content of the basic compound or the basic solvent 30 wt % or less, preferably 5 wt % or less in the total solvent by adjusting the solution composition. This is because the basic compound or the basic solvent acts as a catalyst for intermolecular polycondensation reaction of the PHPS, so that when its ratio based on the total solvent is increased too much, there is possibility that a gel may be generated during storage for a long time at room temperature. Adjustment of this solution composition can be carried out, for example, by heating the PHPS solution obtained in the above-mentioned polycondensation reaction to distill off the basic compound or the solvent contained therein and adding thereafter a non-basic (non-reactive) solvent. If the content of the basic compound in solution is high or if the basic compound is used per se as a reaction solvent, it is possible to improve the stability of the solution by carrying out the operation adjustment of the solution composition. As the non-basic solvent which can be used for the stability improvement of the solution in the present invention, aliphatic hydrocarbons alicyclic hydrocarbons, aromatic hydrocarbons, halogenated hydrocarbons, aliphatic ethers, alicyclic ethers, which are indicated above, and the like may be used.

[Curing Composition]

The curing composition of the present invention comprises the above PHPS and a solvent. Examples of the solvent used to prepare this composition liquid are (a) aromatic compounds such as benzene, toluene, xylene, ethylbenzene, diethylbenzene, trimethylbenzene and triethylbenzene; (b) saturated hydrocarbon compounds such as cyclohexane, decahydronaphthalene, dipentene, n-pentane, i-pentane, n-hexane, i-hexane, n-heptane, i-heptane, n-octane, i-octane, n-nonane, i-nonane, n-decane, ethylcyclohexane, methylcyclohexane, cyclohexane and p-menthane; (c) unsaturated hydrocarbons such as cyclohexene; (d) ethers such as dipropyl ether, dibutyl ether and anisole; (e) esters such as n-butyl acetate, i-butyl acetate, n-amyl acetate and i-amyl acetate; (f) ketones such as methyl isobutyl ketone (MIBK), but not limited to these. Further, by using plural kinds of solvents, it is also possible to adjust the solubility of PHPS and the evaporation speed of the solvent.

So as to improve the workability in the adopted coating method, and considering the permeability of the solution into a fine trench and the film thickness required outside of the trench, the amount of the solvent to the composition can be appropriately selected according to the weight-average molecular weight of the employed PHPS, and distribution and structure thereof. The curable composition of the present invention generally contains from 0.1 to 70 mass %, preferably from 1 to 30 mass % of the PHPS based on the total weight of the composition.

[Method for Forming a Siliceous Film]

The method for forming a siliceous film of the present invention comprises applying the curing composition to a substrate and heating. The shape of the substrate is not particularly limited and may be arbitrarily selected depending on the purpose. However, since the curing composition of the present invention has a feature that it can easily penetrate into a narrow trench portion and form a uniform siliceous film also inside the trench, so that it is preferred to be applied to a substrate having trench portions and holes of high aspect ratio. Specifically, it is preferred to be applied to such a substrate that has at least one trench having a width of the deepest portion of 0.2 μm or less and an aspect ratio of 2 or more, and the like. Here, the shape of the trench is not limited in particular. Its cross section may be any shape such as rectangle, forward tapered shape, reverse tapered shape, curved surface shape, and the like. In addition, both end portions of the trench may be opened or closed.

In the conventional method, even if a siliceous material is tried to be embedded in a trench having a width of the deepest part of 0.2 μm or less and an aspect ratio of 2 or more, inside of the trench is low-densified compared with outside of the trench due to large volume shrinkage at the time of conversion to a siliceous material, so that it has been difficult to embed the trench to make the material homogeneous in and out of the trench. In contrast, according to the present invention, it is possible to obtain a siliceous film, which is uniform inside and outside of the trench. Such an effect of the present invention is more remarkable when a substrate having a very fine trench, which has a width of the deepest portion of 0.1 μm or less, is used.

Representative examples of the substrate having at least one trench of high aspect ratio are substrates for electronic devices comprising transistor elements, bit lines, capacitors, and the like. For the production of such an electronic device, following a step for forming an insulating film called PMD between a transistor element and a bit line, insulating film between a transistor element and a capacitor, between a bit line and a capacitor, or between a capacitor and a metal wire, and an insulating film called IMD between plural metal wires, or for embedding an isolation trench, a step for through-hole plating is sometimes contained, which forms holes vertically through the material embedded in the fine trench.

With respect to substrates of high aspect ratio, the present invention is also suitable for any other applications, where embedding inside and outside of the trenches by a homogeneous siliceous material is needed. Such applications include, for example, an undercoat of a glass for liquid crystal display (Na etc. passivation film), an overcoat of a color filter for liquid crystal display (flattened insulation film), a gas barrier of a film liquid crystal display, a hard coating of a substrate (metal, glass), a heat or oxidation resistant coating, an antifouling coating, a water-repellent coating, a hydrophilic coating, a UV-cutting coating for glass or plastic, and a colored coating.

The method for coating the curing composition to such a substrate is not limited in particular and includes usual methods for coating, for example, a spin coating, a dip coating, a spray coating, a transfer method, a slit coating, and the like.

After the coating of the curing composition, for the purposes of drying or preliminary curing of the coating film, a drying step is carried out in the atmosphere, an inert gas or oxygen gas under the processing conditions, such as for 10 seconds to 30 minutes at a temperature from 50 to 400° C. By drying, the solvent is removed, and the fine trenches are substantially embedded by the PHPS.

According to the present invention, the PHPS contained inside and outside of the trenches is converted to a siliceous material by heating. When heating, it is preferred to perform the heating under an atmosphere containing water vapor.

The atmosphere containing water vapor means the atmosphere, in which the water vapor partial pressure is within a range from 0.5 to 101 kPa, and has a water vapor partial pressure within a range preferably from 1 to 90 kPa, more preferably 1.5 to 80 kPa. Heating can be carried out within a temperature range from 300 to 1200° C.

Incidentally, there are sometimes concerns that the heating in an atmosphere containing water vapor at an elevated temperature, for example, at a temperature exceeding 600° C. affects other element such as an electronic device, which is simultaneously exposed to the heating treatment. In such a case, the silica-converting step may be divided into two or more stages and the heating may be carried out, first in an atmosphere containing water vapor at a relatively low temperature, for example, within a temperature range from 300 to 600° C., and subsequently in an atmosphere containing no water vapor at a higher temperature, for example, within a temperature range from 500 to 1200° C.

Other components than water vapor in the atmosphere containing water vapor (hereinafter referred to as "dilution gas") can be any gas, and specific examples thereof are air, oxygen, nitrogen, helium, argon, and the like. In terms of quality of the obtained siliceous material, it is preferred to use oxygen as the dilution gas. However, the dilution gas is properly selected considering also the influence onto other elements such as electronic devices, which are exposed to the heating treatment. As the atmosphere containing no water vapor in the above-described two-stage heating method, a pressure-reduced atmosphere of less than 1.0 kPa or a vacuum atmosphere may be adopted, besides the atmosphere containing any of the above dilution gas.

Examples of suitable heating conditions, which were set considering these circumstances, are listed below:

(1) After applying the curing composition of the present invention to a given substrate and drying, to heat within a temperature range from 300 to 600° C. and in an atmosphere wherein the water vapor partial pressure is within a range from 0.5 to 101 kPa, and subsequently to heat within a temperature range from 400 to 1200° C. and in an atmosphere wherein the oxygen partial pressure is within a range from 0.5 to 101 kPa;

(2) After applying the curing composition of the present invention to a given substrate and drying, to heat within a temperature range from 300 to 600° C. and in an atmosphere wherein the water vapor partial pressure is within a range from 0.5 to 101 kPa, and subsequently to heat within a temperature range from 400 to 1200° C. and in an atmosphere containing one or more inert gas selected from nitrogen, helium and argon; and (3) After applying the curing composition of the present invention to a given substrate and drying, to heat within a temperature range from 300 to 600° C. and in an atmosphere wherein the water vapor partial pressure is within a range from 0.5 to 101 kPa, and subsequently to heat within a temperature range from 400 to 1200° C. and in a pressure-reduced atmosphere of less than 1.0 kPa or a vacuum atmosphere.

The heating rate to the target temperature and the cooling rate during the heating are not particularly limited and may be generally within a range from 1° C. to 100° C./min. In addition, holding time after reaching the target temperature is not also limited in particular, and it may be generally within a range from 1 minute to 10 hours.

According to the above heating step, the PHPS is converted to a siliceous material mainly composed of Si—O bonds via a hydrolysis reaction with water vapor. In this conversion reaction, volume change before and after the reaction is very small because there is also no decomposition of organic groups. Therefore, when a siliceous film is formed on a surface of a substrate having a trench of a high aspect ratio using the curing composition of the present invention, it becomes homogeneous in either of the inside of the trench or the outside thereof. Further, the method of the present invention has no conformability like CVD method, fine trenches can be uniformly embedded. Although densification of the silica film was insufficient in the conventional method, densification of the film after siliceous conversion is promoted according to the method of the present invention and any crack is unlikely to occur.

As described above, since the siliceous film of the present invention can be obtained by a hydrolysis reaction of a PHPS, it is mainly composed of Si—O bonds; however, it also contains some Si—N bonds depending on degree of the conversion. That is, the fact that Si—N bonds are contained in a siliceous material indicates that the material is derived from a polysilazane. Specifically, the siliceous film of the present invention contains nitrogen in a range from 0.005 to 5% in atomic percent. In fact, it is difficult to make this nitrogen content less than 0.005%. The atomic percent of nitrogen can be measured by atomic absorption spectrometry.

In method for coating a conventional sol-gel method or siloxane-based polymer solution, or method using a polysilazane containing an organic group, a large volumetric shrinkage occurs during the conversion to a siliceous material. Therefore, employing these methods, when a trench of high aspect ratio is embedded by a siliceous material, the siliceous material inside the trench tends to become heterogeneous with respect to density, and the film density is lowered. In the case of the siliceous film of the present invention, almost no volume shrinkage occurs during the conversion to a siliceous material, the siliceous material becomes more homogeneous inside and outside of the trench, and the density of the coating film formed by the silica-conversion can be improved furthermore by stabilizing the oxidation reactivity.

Further, when a volume shrinkage occurs during the conversion to a siliceous material between several trenches having a different trench width, the finer a trench is, the larger the influence of the constraint by the trench wall becomes and the lower the density of the siliceous material tends to be obtained. In the case of the siliceous film of the present invention, almost no volume shrinkage occurs during the conversion to a siliceous material, so that the density becomes uniform in spite of different trench widths.

Incidentally, in the method for forming a siliceous film of the present invention, the thickness of the siliceous film formed on the substrate surface and that of the coating film formed on the surface of the outside of a trench are not particularly limited, and may be generally any thickness in such a range that no crack causes in the film during the conversion to a siliceous material. As described above, any crack is unlikely to occur in the coating film according to the method of the present invention, even when the thickness of the film is 0.5 µm or more. Therefore, for example, at the contact hole having a width of 1000 nm, a trench having a depth of 2.0 µm can be substantially embedded without any defect.

EXAMPLES

Examples of the present invention are described below in more detail.

Synthesis Example 1

Synthesis of Intermediate (A)

The inside of a 10 L reaction vessel, equipped with a cooling condenser, a mechanical stirrer and a temperature controller, was replaced with dry nitrogen and thereafter 7,500 mL of dry pyridine was put into the reaction vessel, which was then cooled down to −3° C. Then, 500 g of dichlorosilane was added to produce a solid adduct ($SiH_2Cl_2.2C_5H_5N$). Upon confirming that the reaction mixture became −3° C. or less, 350 g of ammonia was slowly blown into the reaction mixture while stirring. Subsequently, stirring was continued for 30 minutes, and then dry nitrogen was blown into the liquid layer for 30 minutes to remove excess ammonia. The resulting slurry product was subjected to pressure filtration using 0.2 μm filter made of Teflon (registered trademark) under dry nitrogen atmosphere to obtain 6,000 ml of filtrate. Pyridine was distilled off using an evaporator to obtain a xylol solution of the inorganic polysilazane having 38.9% concentration. The weight-average molecular weight of the resulting inorganic polysilazane was 1401 in terms of polystyrene measured by GPC (eluent: $CHCl_3$). The inorganic polysilazane obtained by this manufacturing process is hereinafter referred to as "Intermediate (A)".

Example 1

The inside of a 10 L reaction vessel, equipped with a cooling condenser, a mechanical stirrer and a temperature controller, was replaced with dry nitrogen, and thereafter 4680 g of dry pyridine, 151 g of dry xylol and 1673 g of the 38.9% Intermediate (A) obtained in Synthesis Example 1 were introduced. Then, they were stirred to be made uniform while bubbling nitrogen gas at 0.5 NL/min. Subsequently, a reforming reaction was performed at 110° C. for 9.6 hours to obtain a PHPS of Example 1.

Followings of the resulting PHPS were shown in Table 2:
(1) weight-average molecular weight Mw,
(2) weight-average molecular weight Mw/number-average molecular weight Mn,
(3) relative value of total amount of $SiH_2$ and $SiH_1$ to the aromatic ring hydrogen in xylol ($R(SiH_{1,2})$),
(4) relative value of the amount of NH to the aromatic ring hydrogens in xylol (R(NH)),
(5) relative value of the amount of $SiH_3$ to the aromatic ring hydrogens in xylol ($R(SiH_3)$),
(6) relative value of the amount of all hydrogens contained in the PHPS to the aromatic ring hydrogens in xylol ($R(SiH_{total})$),
(7) ratio of the amount of NH to the amount of all hydrogens, which is calculated from said relative value (4) and said relative value (6), and
(8) ratio of total amount of $SiH_2$ and $SiH_1$ to the amount of $SiH_3$, which is calculated from said relative value (3) and said relative value (5).

Example 2

Subject to the synthesis according to Example 1 except changing the reforming reaction time to 10.4 hours, a structurally different PHPS was synthesized.
Characteristic values of the resulting PHPS were shown in Table 2.

Example 3

Subject to the synthesis according to Example 1 except changing the reforming reaction time to 9.0 hours, a structurally different PHPS was synthesized. Characteristic values of the resulting PHPS were shown in Table 2

Example 4

The inside of a 10 L reaction vessel, equipped with a cooling condenser, a mechanical stirrer and a temperature controller, was replaced with dry nitrogen, and thereafter 5697 g of dry pyridine, 428 g of dry xylol and 1790 g of the 41.3% Intermediate (A) having Mw of 1388 obtained in the same way as Synthesis Example 1 were introduced. Then, they were stirred to be made uniform while bubbling nitrogen gas at 0.5 NL/min. Subsequently, a reforming reaction was performed at 130° C. for 8.2 hours to obtain a PHPS of Example 4.

Comparative Example 1

The xylol solution of the inorganic polysilazane obtained in Synthesis Example 1 was set as Comparative Example 1.

Comparative Example 2

Subject to the synthesis according to Example 1 except changing the reforming reaction to that at 100° C. for 11.4 hours, a structurally different PHPS was synthesized. Characteristic values of the resulting PHPS were as shown in Table 2.

Comparative Example 3

The inside of a 10 L reaction vessel, equipped with a cooling condenser, a mechanical stirrer and a temperature controller, was replaced with dry nitrogen and thereafter 7,000 ml of dry xylol and 500 ml of dry pyridine were put into the reaction vessel, which was cooled down to −3° C. Then, 500 g of dichlorosilane was added to produce a solid adduct ($SiH_2Cl_2. 2C_5H_5N$). Upon confirming that the reaction mixture became 30° C., 350 g of ammonia was slowly blown into the reaction mixture while stirring. Subsequently, stirring was continued for 30 minutes, and then dry nitrogen was blown into the liquid layer for 30 minutes to remove excess ammonia. The resulting slurry product was subjected to pressure filtration using 0.2 μm filter made of Teflon (registered trademark) under dry nitrogen atmosphere to obtain 6,000 ml of filtrate. Pyridine was distilled off using an evaporator to obtain a xylol solution of the inorganic polysilazane having 39.8% concentration. The weight-average molecular weight of the resulting inorganic polysilazane was 12368 in terms of polystyrene measured by GPC (eluent: $CHCl_3$). Characteristic values of the resulting PHPS were shown in Table 2.

Comparative Example 4

Subject to the synthesis according to Example 1 except changing the reforming reaction to that at 130° C. for 7.0 hours, a structurally different PHPS was synthesized. Characteristic values of the resulting PHPS were shown in Table

Comparative Example 5

Subject to the synthesis according to Example 1 except changing the reforming reaction to that at 140° C. for 6.0 hours, a structurally different PHPS was synthesized. Characteristic values of the resulting PHPS were shown in Table

Comparative Example 6

Subject to the synthesis according to Example 1 except changing the reforming reaction to that at 150° C. for 5.1 hours, a structurally different PHPS was synthesized. Characteristic values of the resulting PHPS were shown in Table 2.

TABLE 2

|  | Mw | Mw/Mn | R(SiH$_{1.2}$) | R(NH) | R(SiH$_3$) | R(SiH$_{total}$) | NH/SiH$_{total}$ | SiH$_{1.2}$/SiH$_3$ |
|---|---|---|---|---|---|---|---|---|
| Example 1 | 7772 | 4.39 | 0.210 | 0.049 | 0.054 | 0.263 | 0.188 | 3.90 |
| Example 2 | 10108 | 5.09 | 0.195 | 0.042 | 0.051 | 0.247 | 0.168 | 3.81 |
| Example 3 | 5757 | 3.70 | 0.230 | 0.050 | 0.059 | 0.289 | 0.174 | 3.88 |
| Example 4 | 14977 | 6.45 | 0.187 | 0.038 | 0.050 | 0.237 | 0.161 | 3.76 |
| Comparative Example 1 | 1401 | 1.82 | 0.250 | 0.062 | 0.056 | 0.305 | 0.202 | 4.50 |
| Comparative Example 2 | 3068 | 2.99 | 0.240 | 0.057 | 0.060 | 0.300 | 0.188 | 3.99 |
| Comparative Example 3 | 12368 | 6.26 | 0.185 | 0.066 | 0.105 | 0.289 | 0.226 | 1.76 |
| Comparative Example 4 | 18540 | 7.21 | 0.167 | 0.027 | 0.052 | 0.219 | 0.123 | 3.19 |
| Comparative Example 5 | 34191 | 9.95 | 0.053 | 0.019 | 0.017 | 0.070 | 0.270 | 3.15 |
| Comparative Example 6 | 115763 | 22.91 | 0.284 | 0.098 | 0.071 | 0.355 | 0.247 | 4.72 |

[Evaluation of Oxidation Stability of PHPS]

A coating liquid was prepared by adjusting the concentration of each PHPS so as to become a coating film of 300 nm. The resulting coating liquid was spin-coated at a rotational speed of 1000 rpm onto a 4-inch wafer using a spin coater (Spin Coater 1HDX2 (trade name), manufactured by Mikasa Co., Ltd.). The obtained coating film was exposed to 22.5° C. for 15 minutes at a 50.5% humidity. Immediately after the film formation and after the exposure, elementary analyses were performed using Pelletron 3SDH (trade name, manufactured by National Electrostatics Corporation) by means of Rutherford backscattering spectroscopy. The obtained results were shown in Table 3.

(a) The Number of Defects

A coating liquid was prepared by adjusting the concentration of each PHPS so as to become a coating film of 580 nm. The resulting coating liquid was spin-coated at a rotational speed of 1000 rpm onto a 12-inch wafer using a spin coater (ACT12 SOD (trade name), manufactured by Tokyo Electron Co., Ltd.) and pre-baked for 3 minutes on a hot plate of 150° C. The film thickness after the pre-baking was measured by M-44 type spectroscopic ellipsometer (trade name, manufactured by J. A. Woollam Co., Inc.), and it was confirmed that each sample had a uniform thickness (about 580 nm). Thereafter, a defect inspection for the film on the wafer was carried out by LS9100 (trade name, manufactured

TABLE 3

|  | immediately after film formation | | | | after 15 minutes exposure | | | |
|---|---|---|---|---|---|---|---|---|
|  | Si (atomic %) | H (atomic %) | N (atomic %) | O (atomic %) | Si (atomic %) | H (atomic %) | N (atomic %) | O (atomic %) |
| Example 1 | 44.6 | 21.5 | 33.9 | 0.0 | 44.2 | 21.3 | 34.5 | 0.0 |
| Example 2 | 45.4 | 20.1 | 34.5 | 0.0 | 45.1 | 19.7 | 35.2 | 0.0 |
| Example 3 | 41.8 | 23.6 | 34.6 | 0.0 | 42.5 | 22.7 | 34.8 | 0.0 |
| Example 4 | 45.8 | 19.3 | 34.8 | 0.0 | 45.6 | 19.1 | 35.3 | 0.0 |
| Comparative Example 1 | 40.8 | 24.3 | 34.9 | 0.0 | 40.9 | 22.8 | 33.5 | 2.8 |
| Comparative Example 2 | 41.5 | 23.9 | 34.6 | 0.0 | 41.8 | 22.0 | 33.4 | 2.8 |
| Comparative Example 3 | 45.2 | 23.6 | 31.2 | 0.0 | 45.0 | 23.9 | 31.1 | 3.3 |
| Comparative Example 4 | 46.6 | 17.9 | 35.4 | 0.0 | 46.3 | 17.6 | 36.1 | 0.0 |
| Comparative Example 5 | 48.0 | 15.6 | 36.4 | 0.0 | 47.6 | 16.0 | 36.4 | 0.0 |
| Comparative Example 6 | 40.3 | 29.0 | 30.7 | 0.0 | 40.5 | 29.4 | 30.1 | 4.4 |

From this result, it has been found that when a composition comprising the PHPS of the present invention was applied onto a silicon wafer and the coating film was exposed to the atmosphere, oxidation hardly caused. From this, it has been found that the PHPS having a specific structure of the present invention has remarkably improved stability against oxidation by the atmosphere.

[Evaluation of PHPS]

Regarding the obtained siliceous film, defects on a surface, voids in a trench, shrinkage rate and wet etching rate were evaluated. Evaluation methods are shown in the following, respectively.

by Hitachi High-Technologies Corporation) and UVision4 (trade name, manufactured by Applied Materials, Inc.).

(b) The Number of Voids

A coating liquid containing a PHPS was coated at 1000 rpm using a spin coater (Mark8 (trade name), manufactured by Tokyo Electron Co., Ltd.). The silicon wafer had a rectangular vertical section and a trench of 500 nm depth and 50 nm width. The coated wafer was subjected to pre-baking at 150° C. for 3 minutes. Thereafter, it was cured in a furnace (VF1000LP, manufactured by Koyo Thermo Systems Co., Ltd.) under a water vapor atmosphere of 400° C. for 30 minutes, followed by annealing under a nitrogen atmosphere of 400° C. A trench pattern portion was cut perpendicular to the trench direction, and the wafer sample after annealed was then immersed in an aqueous solution containing 5 wt % of ammonium fluoride and 0.5 wt % of hydrofluoric acid for 30 seconds. After washing with pure water, the wafer sample was dried, and a SEM observation was then carried out. 200 points of trenches were observed and the number of trenches in which voids were confirmed were set as the number of voids.

(c) Shrinkage Rate

A coating liquid was prepared by adjusting the concentration of each PHPS so as to become a coating film of 580 nm.

The resulting coating liquid was coated at 1000 rpm onto a bare silicon wafer using a spin coater (Mark8 (trade name), manufactured by Tokyo Electron Co., Ltd.). The coated wafer was subjected to pre-baking at 150° C. for 3 minutes and the thickness of the resulting coated film was measured by M-44 type spectroscopic ellipsometer (trade name, manufactured by J. A. Woollam Co., Inc.) to obtain an initial film thickness. Thereafter, it was cured in a furnace (VF1000LP (trade name), manufactured by Koyo Thermo Systems Co., Ltd.) under a water vapor atmosphere of 400° C. for 30 minutes, followed by annealing under a nitrogen atmosphere of 400° C. The film thickness of each sample after annealed was measured by a spectroscopic ellipsometer (M-2000V (trade name), manufactured by J. A. Woollam Co., Inc.). The shrinkage rate was calculated by the following equation:

[(Initial film thickness)−(film thickness after annealed)]/(initial film thickness)×100=shrinkage rate (%)

(e) Wet Etching Rate

A coating liquid was prepared by adjusting the concentration of each PHPS so as to become a coating film of 580 nm. The prepared coating liquid was filtered through a filter made of PTFE, which had a filtration accuracy of 0.02 μm. The coating liquid after the filtration was coated onto a silicon wafer at 1000 rpm using a spin coater (Mark8, manufactured by Tokyo Electron Co., Ltd.). The silicon wafer had a trench with a rectangular vertical section and 500 nm depth and 50 nm width. The coated wafer was subjected to pre-baking at 150° C. for 3 minutes. Thereafter, it was cured in a furnace (VF1000LP, manufactured by Koyo Thermo Systems Co., Ltd.) under a water vapor atmosphere of 400° C. for 30 minutes, followed by annealing under a nitrogen atmosphere of 400° C. Then, a polishing was carried out to the outermost surface of the trench by means of chemical mechanical polishing (CMP) to remove the excess film on the substrate.

The obtained siliceous film-coated silicon wafer and a thermal oxide film-coated silicon wafer as a reference were immersed at 20° C. in an aqueous solution containing 0.5 wt % of hydrofluoric acid, then washed well with pure water and dried. Cross-sections of the silicon wafers were observed by means of an electron microscope, and concerning a portion having no trench (blanket portion) and a portion the inside of the trench, the etching rate of the sample was calculated by means of a linear approximation from the relation between an etching time and an amount of decrease in film thickness, and also the etching rate was calculated by calculating a ratio of etching rate of the sample film to the thermal oxide film.

The obtained results of the evaluation were shown in Table 4.

TABLE 4

| | PHPS properties | | | | number of defects | | number of voids | shrinkage rate (%) | wet etching rate | |
|---|---|---|---|---|---|---|---|---|---|---|
| | Mw | Mw/Mn | R(SiH$_{1,2}$) | R(NH) | LS9110 | Uvision | | | blanket | trench |
| Example 1 | 7772 | 4.39 | 0.210 | 0.049 | 33 | 94 | 0 | 13.1 | 4.35 | 8.90 |
| Example 2 | 10108 | 5.09 | 0.195 | 0.042 | 25 | 101 | 0 | 13.0 | 4.21 | 8.70 |
| Example 3 | 5757 | 3.70 | 0.230 | 0.050 | 25 | 86 | 0 | 13.3 | 4.22 | 9.20 |
| Example 4 | 14977 | 6.45 | 0.187 | 0.038 | 19 | 79 | 0 | 13.1 | 4.11 | 8.57 |
| Comparative Example 1 | 1401 | 1.82 | 0.250 | 0.062 | 100000 | 221 | 0 | 14.2 | 4.96 | 14.0 |
| Comparative Example 2 | 3068 | 2.99 | 0.240 | 0.057 | 152 | 184 | 0 | 13.6 | 4.58 | 12.7 |
| Comparative Example 3 | 12368 | 6.26 | 0.185 | 0.066 | 100000 | 250000 | 4 | 11.9 | 4.87 | 14.1 |
| Comparative Example 4 | 18540 | 7.21 | 0.167 | 0.027 | 16 | 69 | 58 | 14.5 | 4.64 | 12.10 |
| Comparative Example 5 | 34191 | 9.95 | 0.053 | 0.019 | 13 | 63 | 186 | 13.7 | 5.45 | 17.90 |
| Comparative Example 6 | 115763 | 22.91 | 0.582 | 0.174 | 100000 | 250000 | 200 | 14.3 | 7.21 | 26.80 |

From the obtained results, it has been found that the coated film formed using the PHPS of the present invention has fewer defects and voids and also that the wet etching rate thereof is low.

The invention claimed is:

1. A perhydropolysilazane having a weight-average molecular weight of 5,000 to 17,000, characterized in that when $^1$H-NMR of a 17% by weight solution of said perhydropolysilazane dissolved in xylol is measured, the ratio of the amount of SiH$_{1,2}$ based on the amount of the aromatic ring hydrogen content of the xylol is 0.235 or less and the ratio of the amount of NH based on the amount of the aromatic ring hydrogen content of the xylol is 0.055 or less, wherein the perhydropolysilazane contains a structure of the following formula:

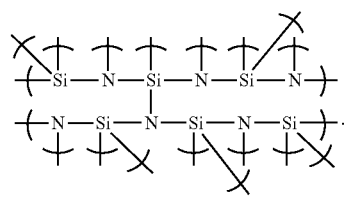

2. The perhydropolysilazane according to claim 1, wherein the perhydropolysilazane comprises a repeating unit selected from the group consisting of the general formulae (Ia), (Ib), (Ic), (Id), (Ie), and (If) and a terminal group of the formula (Ig).

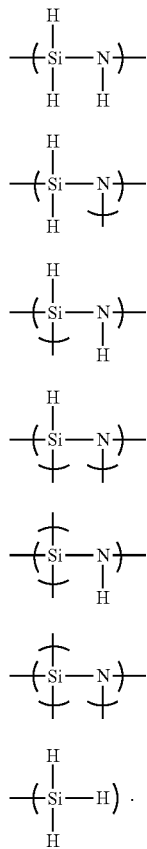

3. The perhydropolysilazane according to claim 1, wherein the weight-average molecular weight is 5,700 to 15,000.

4. A curing composition comprising the perhydropolysilazane according to claim 1 and a solvent.

5. The curing composition according to claim 4, wherein said solvent is selected from a group consisting of (a) an aromatic compound, (b) a saturated hydrocarbon compound, (c) an unsaturated hydrocarbon compound, (d) an ether, (e) an ester, and (f) a ketone.

6. The curing composition according to claim 4, wherein the composition comprises 0.1 to 70 mass% of the perhydropolysilazane based on the total amount of the composition.

7. A method for forming a siliceous film, comprising coating the curing composition according to claim 4 on a substrate and heating.

8. The method for forming a siliceous film according to claim 7, wherein said heating is performed under a water vapor atmosphere.

9. A curing composition comprising the perhydropolysilazane according to claim 2 and a solvent.

10. A curing composition comprising the perhydropolysilazane according to claim 3 and a solvent.

11. The curing composition according to claim 5, wherein the composition comprises 0.1 to 70 mass% of the perhydropolysilazane based on the total amount of the composition.

12. The curing composition according to claim 6, wherein the composition comprises 0.1 to 70 mass% of the perhydropolysilazane based on the total amount of the composition.

* * * * *